United States Patent
Liu

(10) Patent No.: US 8,431,948 B2
(45) Date of Patent: Apr. 30, 2013

(54) LIGHT EMITTING DIODE PACKAGE AND FABRICATION METHOD THEREOF

(75) Inventor: Yu-Huan Liu, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 0 days.

(21) Appl. No.: 13/414,555

(22) Filed: Mar. 7, 2012

(65) Prior Publication Data

US 2012/0168804 A1 Jul. 5, 2012

Related U.S. Application Data

(62) Division of application No. 12/606,013, filed on Oct. 26, 2009.

(30) Foreign Application Priority Data

Feb. 4, 2009 (TW) ................ 98103449 A

(51) Int. Cl.
*H01L 33/00* (2010.01)
(52) U.S. Cl.
USPC ............ 257/98; 257/99; 257/100; 438/25; 438/26; 438/27; 438/28; 438/29; 438/110; 438/116
(58) Field of Classification Search ........ 438/25–29, 438/110, 116; 257/98–100
See application file for complete search history.

(56) References Cited

U.S. PATENT DOCUMENTS

| 6,294,410 B1 | 9/2001 | Jiang et al. |
| 6,841,422 B2 | 1/2005 | Jiang et al. |
| 8,035,125 B2 | 10/2011 | Abe |
| 2008/0087996 A1 | 4/2008 | Miyaki et al. |
| 2009/0267104 A1 | 10/2009 | Hsu et al. |

FOREIGN PATENT DOCUMENTS

| CN | 2413390 | 1/2001 |
| CN | 1588652 | 3/2005 |
| CN | 101159302 | 4/2008 |
| JP | 4277670 | 10/1992 |
| JP | 7106501 | 4/1995 |
| TW | 200824158 | 6/2008 |
| TW | M343242 | 10/2008 |

OTHER PUBLICATIONS

USPTO, Non-Final Office Action in U.S. Appl. No. 12/606,013, Mar. 23, 2012, pp. 2-7.

*Primary Examiner* — Bac Au
(74) *Attorney, Agent, or Firm* — Han IP Law PLLC

(57) ABSTRACT

A light emitting diode package and a fabrication method thereof are provided. The light emitting diode package comprises a lead frame, having a frame body and a conductive layer covering the frame body. A reflector has a first portion and a second portion sandwiching the lead frame, wherein the first portion has a depression to expose the lead frame, and a light emitting diode chip is disposed on the lead frame in the depression. The fabrication method comprises forming a frame body and forming a conductive layer covering the frame body to form a lead frame. A first portion and a second portion of a reflector are formed to sandwich the lead frame, wherein the first portion has a depression to expose the lead frame. A light emitting diode chip is disposed on the lead frame in the depression.

19 Claims, 2 Drawing Sheets

LIGHT EMITTING DIODE PACKAGE AND FABRICATION METHOD THEREOF

CROSS-REFERENCE TO RELATED APPLICATION

This application is a divisional application of and claims the priority benefit of U.S. patent application Ser. No. 12/606,013, filed Oct. 26, 2009, which claims the priority benefit of Taiwan Patent Application No. 98103449, filed Feb. 4, 2009. These patent applications are herein incorporated in their entirety by reference.

BACKGROUND OF THE INVENTION

1. Field of the Invention

The present invention relates to an electronic device package, and in particular relates to a light emitting diode package.

2. Description of Related Art

Light emitting diodes are one kind of semiconductor device, which have a P-type and an N-type semiconductor layer. When a forward voltage is applied to the light emitting diode, electrons flow from electrodes and holes come from electrodes toward an interface between the P-type and the N-type semiconductor layers to combine and produce energy. Then, the energy is released in a light form. Light emitting diodes have several advantages over other conventional light sources such as high brightness, small sizes, lighter weights, lower power consumption and longer operating lifespan, such that they are widely applied to various light sources and display devices.

FIG. 1 shows a cross section of a conventional light emitting diode package. A plastic material 10 formed by injection molding is used to sandwich a metal lead frame 12 to form a carrier for a light emitting diode 14. The light emitting diode 14 is disposed on the lead frame 12 and a conductive wire 16 is used to electrically connect the light emitting diode 14 and the lead frame 12. Then, a depression of the plastic material 10 of the carrier is filled with an encapsulant 18 to cover the light emitting diode 14, to form the conventional light emitting diode package.

However, in the conventional light emitting diode package, the difference between a thermal expansion coefficient of the plastic material 10 of the carrier and a thermal expansion coefficient of the metal lead frame 12 is large. In general, the thermal expansion coefficient of the plastic material 10 is usually about 100 ppm/° C., but the thermal expansion coefficient of the lead frame 12 is usually about 20 ppm/° C. Accordingly, adhesion between the plastic material 10 of the carrier and the lead frame 12 is poor. Thus as the conventional light emitting diode package is exposed to heat and cold, a gap is produced between the plastic material 10 of the carrier and the lead frame 12, such that water vapor may easily permeate through the gap and decrease reliability of the light emitting diode.

Additionally, for the conventional light emitting diode package, a shape of the lead frame 12 is formed from bending by a mechanical process. Accordingly, a gap is easily produced between the plastic material 10 of the carrier and the lead frame 12 to further decrease reliability of the light emitting diode.

Therefore, a light emitting diode package and a fabrication method which can overcome the above mentioned problems of the conventional light emitting diode packages is therefore desired.

BRIEF SUMMARY OF THE INVENTION

According to an illustrative embodiment, a light emitting diode package is provided. The light emitting diode package comprises: a lead frame having a frame body and a conductive layer covering the frame body; a reflector having a first portion and a second portion sandwiching the lead frame, wherein the first portion has a depression to expose the lead frame; and a light emitting diode chip disposed on the lead frame in the depression.

According to another illustrative embodiment, a method for fabricating a light emitting diode package is provided. The method comprises: forming a frame body and forming a conductive layer covering the frame body to form a lead frame; forming a first portion and a second portion of a reflector to sandwich the lead frame, wherein the first portion has a depression to expose the lead frame, and the lead frame extends to a side and a portion of a lower surface of the second portion of the reflector; and disposing a light emitting diode chip on the lead frame in the depression.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
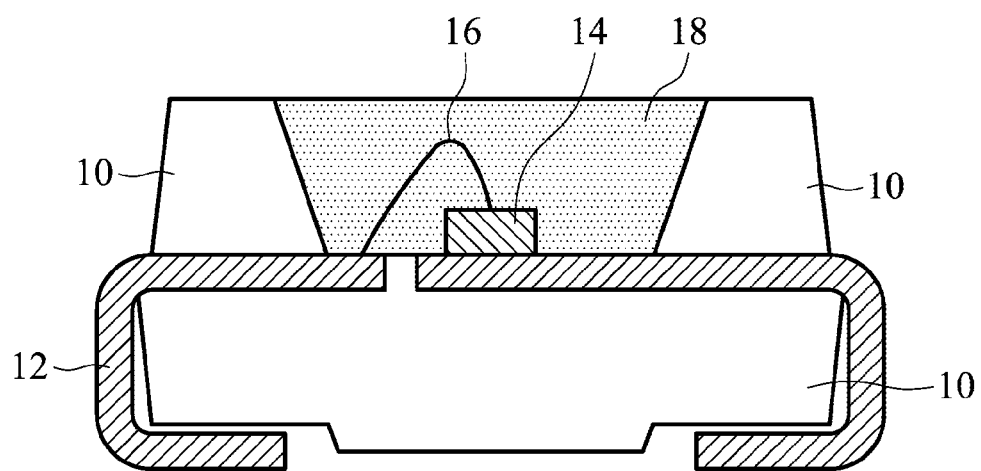
FIG. 1 shows a illustrative cross section of a conventional light emitting diode package.
Figure 2:
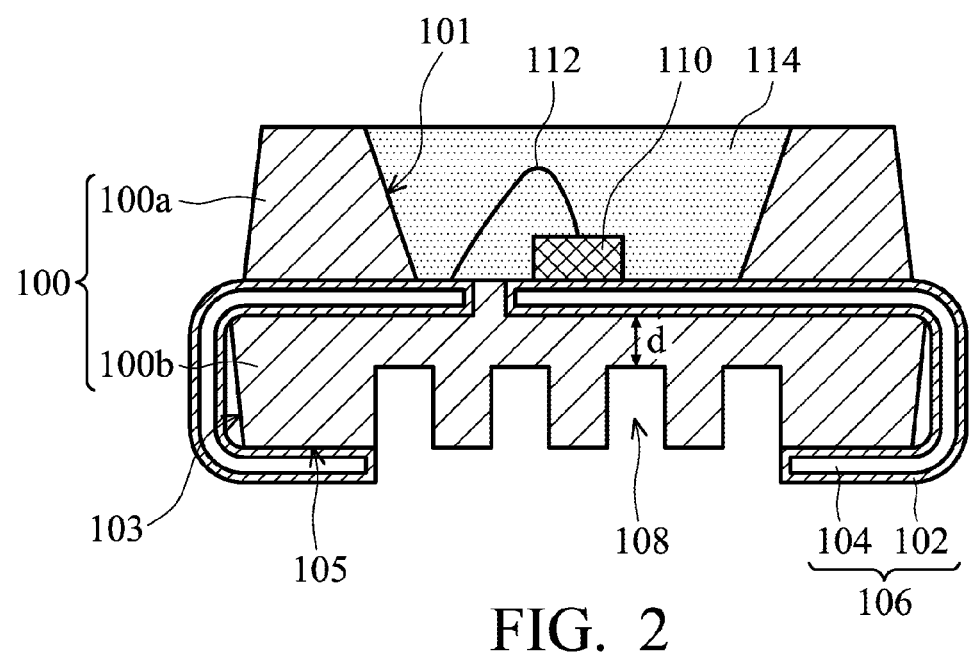
FIG. 2 shows an illustrative cross section of a light emitting diode package according to an embodiment of the invention.

Referring to FIG. 2, a cross section of a light emitting diode package according to an embodiment of the invention is shown. First, a frame body 104 of a lead frame 106 is provided. The materials of the frame body 104 may be a thermoplastic plastic material, for example polyphthalamide (PPA), liquid crystal polymer (LCP) or other suitable materials. The frame body 104 can be formed by an injection molding or a compression molding step.

Then, a conductive layer 102 is formed on a surface of the frame body 104. The materials of the conductive layer 102 may be indium tin oxide (ITO), metal or other conductive materials. The metal material is material such as aluminum, gold or silver. The thickness of the conductive layer 102 may be about 5 µm. The conductive layer 102 can be formed on the frame body 104 by a physical vapor deposition (PVD), a chemical vapor deposition (CVD), a coating process, or an electroplating process step, thus completing fabrication of the lead frame 106.

Next, the thermoplastic plastic material is processed by a stamping press molding or an injection molding step to form a first portion 100a and a second portion 100b of a reflector 100 for sandwiching the lead frame 106. The lead frame 106 is extended to a side 103 and a portion of a lower surface 105 of the second portion 100b of the reflector 100. The materials of the reflector 100 may be polyphthalamide (PPA), liquid crystal polymer (LCP) or other suitable materials.

The first portion 100a of the reflector 100 has a depression 101 to expose the lead frame 106. The shape of the depression 101 can be any shape. In an embodiment of the invention, the lower surface 105 of the second portion 100b of the reflector 100 can further have a plurality of depressions 108 thereon. The shape of the depressions 108 can be any shapes, and the numbers and the arrangements of the depressions 108 are not limited. The depression 101 of the first portion 100a and the depressions 108 of the second portion 100b of the reflector 100 can be formed together with the step of forming the reflector 100 by the stamping press molding step. No additional steps are needed to form the depression 101 and the depressions 108.

In an embodiment of the invention, one characteristic of the light emitting diode package is that a thermal expansion coefficient of the reflector 100 is similar to a thermal expansion coefficient of the frame body 104 of the lead frame 106. The difference between the thermal expansion coefficients of the reflector 100 and the frame body 104 of the lead frame 106 is less than 40 ppm/° C., and can be between about 20 and 40 ppm/° C. In an embodiment of the invention, the thermal expansion coefficients of the reflector 100 may be about 100 ppm/° C. and the thermal expansion coefficients of the frame body 104 of the lead frame 106 may be about 60 to 120 ppm/° C. In the light emitting diode packages of the invention, the thermal expansion coefficients of the reflector 100 and the frame body 104 of the lead frame 106 are the same, such that if the light emitting diode packages are exposed to heat and cold, no gap will be produced between the reflector 100 and the lead frame 106. Therefore, the light emitting diode packages of the invention prevent water vapor from easily permeating through a gap between the reflector 100 and the lead frame 106, increasing reliability of light emitting diodes.

Moreover, in an embodiment of the light emitting diode package of the invention, the lower surface 105 of the second portion 100b of the reflector 100 has the plurality of depressions 108 thereon, such that a heat dissipation area of the reflector 100 is increased. Meanwhile, a distance d between a bottom of the depression 108 and the lead frame 106 is small, such that heat dissipation capability of the light emitting diode package is enhanced and stability of the light emitting diode package is enhanced. In an embodiment of the invention, the distance d may be about 0.2 mm.

In an embodiment of the fabrication method of the light emitting diode package of the invention, the lead frame 106 is formed first, and then the first portion 100a and the second portion 100b of the reflector 100 are formed to sandwich the lead frame 106. Therefore, the second portion 100b of the reflector 100 can be tightly fit into the lead frame 106, minimizing the gap between the reflector 100 and the lead frame 106 to prevent water vapor from permeating through the gap and enhancing reliability of the light emitting diode package.

Next, a light emitting diode chip 110 is disposed on the lead frame 106 in the depression 101 of the reflector 100. A contact (not shown) of the light emitting diode chip 110 is directly contacted with the lead frame 106 and a lead 112 is utilized for electrically connecting another contact (not shown) of the light emitting diode chip 110 to the lead frame 106. Then, an encapsulant 114 is utilized to fill the depression 101 of the reflector 100, covering the light emitting diode chip 110 and the lead 112, completing fabrication of an embodiment of the light emitting diode package of the invention.

As the above mentions, the light emitting diode packages of the invention and the fabrication methods thereof can enhance the seal between the reflector and the lead frame. Moreover, the invention can prevent a gap from being produced between the reflector and the lead frame to reduce water vapor permeation into the light emitting diode packages, thus enhancing the reliability of the light emitting diode. Meanwhile, the design of the plurality of depressions on the bottom of reflector also can enhance heat dissipation capability of the light emitting diode packages, and further improve the stability of the light emitting diode packages.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode package, comprising:
a lead frame, having a non-metal frame body and a conductive layer covering the non-metal frame body;
a reflector, having a first portion and a second portion sandwiching the lead frame, a first surface of the first portion of the reflector including a first depression that exposes at least a portion of the lead frame, a second surface of the first portion of the reflector opposite to the first surface being in contact with the lead frame, a first surface of the second portion of the reflector being in contact with the lead frame, a second surface of the second portion of the reflector opposite to the first surface of the second portion of the reflector including at least one second depression thereon, a depth of the at least one second depression being more than half of, but not through, a distance between the first surface and the second surface of the second portion of the reflector to provide an increased surface area for heat dissipation; and
a light emitting diode chip disposed on the lead frame in the first depression of the reflector.

2. The light emitting diode package as claimed in claim 1, wherein a difference between a thermal expansion coefficient of the frame body of the lead frame and a thermal expansion coefficient of the reflector is between about 20 ppm/° C. and about 40 ppm/° C.

3. The light emitting diode package as claimed in claim 1, wherein a distance between a bottom surface of the at least one second depression and the first surface of the second portion of the reflector is about 0.2 mm.

4. The light emitting diode package as claimed in claim 3, wherein the lead frame extends to a side and a portion of the second surface of the reflector.

5. The light emitting diode package as claimed in claim 1, further comprising a lead electrically connecting a first contact of the light emitting diode chip with the lead frame, wherein a second contact of the light emitting diode chip directly contacts with the lead frame.

6. The light emitting diode package as claimed in claim 1, further comprising an encapsulant filling the first depression of the first portion of the reflector and covering the light emitting diode chip.

7. The light emitting diode package as claimed in claim 1, wherein a material of the conductive layer of the lead frame comprises indium tin oxide (ITO) or metal.

8. The light emitting diode package as claimed in claim 1, wherein a material of the frame body of the lead frame comprises polyphthalamide or liquid crystal polymer.

9. The light emitting diode package as claimed in claim 1, wherein a material of the reflector comprises polyphthalamide or liquid crystal polymer.

10. A light emitting diode package, comprising:
a lead frame, having a non-metal frame body of a first thermal expansion coefficient and a conductive layer covering the non-metal frame body;

a reflector of a second thermal expansion coefficient that differs from the first thermal expansion coefficient by about 20 ppm/° C. to about 40 ppm/° C., the reflector having a first portion and a second portion sandwiching the lead frame, a first surface of the reflector on the first portion including a first depression that exposes at least a portion of the lead frame, wherein a second surface of the reflector on the second portion that is opposite to a first surface of the reflector on the second portion being in contact with the lead frame further comprises at least one second depression thereon, a depth of the at least one second depression being more than half of, but not through, a distance between the first surface and the second surface of the second portion of the reflector to provide an increased surface area for heat dissipation; and a light emitting diode chip disposed on the lead frame in the first depression of the reflector.

11. The light emitting diode package as claimed in claim 10, wherein the lead frame extends to a side and a portion of the second surface of the reflector.

12. The light emitting diode package as claimed in claim 10, further comprising a lead electrically connecting a first contact of the light emitting diode chip with the lead frame, wherein a second contact of the light emitting diode chip directly contacts with the lead frame.

13. The light emitting diode package as claimed in claim 10, further comprising an encapsulant filling the depression of the first portion of the reflector and covering the light emitting diode chip.

14. The light emitting diode package as claimed in claim 10, wherein a material of the conductive layer of the lead frame comprises indium tin oxide (ITO) or metal.

15. The light emitting diode package as claimed in claim 10, wherein a material of the frame body of the lead frame comprises polyphthalamide or liquid crystal polymer.

16. The light emitting diode package as claimed in claim 10, wherein a material of the reflector comprises polyphthalamide or liquid crystal polymer.

17. A light emitting diode package, comprising:
a lead frame, having a non-metal frame body of a first thermal expansion coefficient and a conductive layer covering the non-metal frame body;
a reflector of a second thermal expansion coefficient that differs from the first thermal expansion coefficient, having a first portion and a second portion sandwiching the lead frame, a first surface of the reflector on the first portion including a first depression that exposes at least a portion of the lead frame, a second surface of the reflector on the second portion that is opposite to a first surface of the second portion of the reflector being in contact with the lead frame including at least one second depression thereon, a depth of the at least one second depression being more than half of, but not through, a distance between the first surface and the second surface of the second portion of the reflector to provide an increased surface area for heat dissipation; and
a light emitting diode chip disposed on the lead frame in the first depression of the reflector.

18. The light emitting diode package as claimed in claim 17, wherein a material of the conductive layer of the lead frame comprises indium tin oxide (ITO) or metal, wherein a material of the frame body of the lead frame comprises polyphthalamide or liquid crystal polymer, and wherein a material of the reflector comprises polyphthalamide or liquid crystal polymer.

19. The light emitting diode package as claimed in claim 17, wherein a distance between a bottom surface of the at least one second depression and the first surface of the second portion of the reflector is about 0.2 mm.

* * * * *